United States Patent
Ito

(10) Patent No.: US 7,524,618 B2
(45) Date of Patent: Apr. 28, 2009

(54) RESIST PATTERN FORMING METHOD, SEMICONDUCTOR APPARATUS USING SAID METHOD, AND EXPOSURE APPARATUS THEREOF

(75) Inventor: Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 609 days.

(21) Appl. No.: 11/084,001

(22) Filed: Mar. 21, 2005

(65) Prior Publication Data

US 2005/0221234 A1 Oct. 6, 2005

(30) Foreign Application Priority Data

Mar. 24, 2004 (JP) ............................ 2004-087420

(51) Int. Cl.
*G03F 7/20* (2006.01)
(52) U.S. Cl. ...................................... 430/311; 430/330
(58) Field of Classification Search ................ 430/311, 430/329, 330, 331; 134/1.3
See application file for complete search history.

(56) References Cited

U.S. PATENT DOCUMENTS

| 6,191,429 B1 | 2/2001 | Suwa |
| 6,451,150 B2 | 9/2002 | Feldman et al. |
| 6,730,447 B2 | 5/2004 | Ito et al. |
| 2004/0043310 A1 | 3/2004 | Takeishi et al. |
| 2004/0180299 A1 | 9/2004 | Rolland et al. |
| 2005/0046934 A1 | 3/2005 | Ho et al. |
| 2005/0250054 A1 * | 11/2005 | Chang .......................... 430/329 |
| 2006/0061747 A1 | 3/2006 | Ishii |
| 2006/0152698 A1 | 7/2006 | Ishii |
| 2006/0177777 A1 | 8/2006 | Kawamura et al. |

FOREIGN PATENT DOCUMENTS

| EP | 1 624 481 A1 | 2/2006 |
| EP | 1 814 144 A1 | 8/2007 |
| JP | 10-303114 | 11/1998 |
| JP | 2000-058436 | 2/2000 |
| JP | 2005-101487 | 4/2005 |
| JP | 2006-523029 | 10/2006 |
| WO | WO 2004/092830 A2 | 10/2004 |

OTHER PUBLICATIONS

Search report mailed Oct. 5, 2007, issued by the Netherlands Patent Office in counterpart Netherlands Patent Application No. 1028595.
Takeishi, T. et al., "Processing Method and Semiconductor Manufacturing method", U.S. Appl. No. 10/916,414, filed Aug. 12, 2004.
Owa, S. et al., "Immersion Lithography: Its Potential Performance and Issues," Proceedings of SPIE, vol. 5040, pp. 724-733, (2003).
Decision of Rejection for Japanese Patent Application No. 2004-087420, mailed Jul. 15, 2008 (2 pages).
Notification of Reasons for Rejection for Japanese Patent Application No. 2007-180381, mailed Aug. 19, 2008, and English Language translation thereof.

* cited by examiner

*Primary Examiner*—Kathleen Duda
(74) *Attorney, Agent, or Firm*—Finnegan, Henderson, Farabow, Garrett & Dunner, L.L.P.

(57) ABSTRACT

In immersion exposure, a resist pattern forming method suppressing resist pattern defects comprises mounting a substrate formed a resist film thereon and a reticle formed a pattern thereon onto an exposure apparatus, supplying a first chemical solution onto the resist film to selectively form a first liquid film in a local area on the resist film and draining the solution, the first liquid film having a flow and being formed between the resist film and a projection optical system, transferring the pattern of the reticle to the resist film through the first liquid film to form a latent image, supplying a second chemical solution onto the resist film to clean the resist film, heating the resist film, and developing the resist film to form a resist pattern from the resist film.

18 Claims, 6 Drawing Sheets

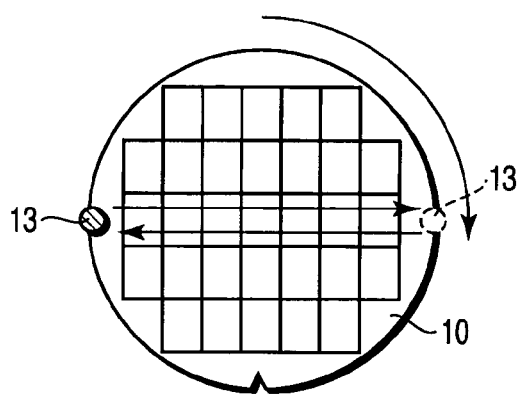
F I G. 3A
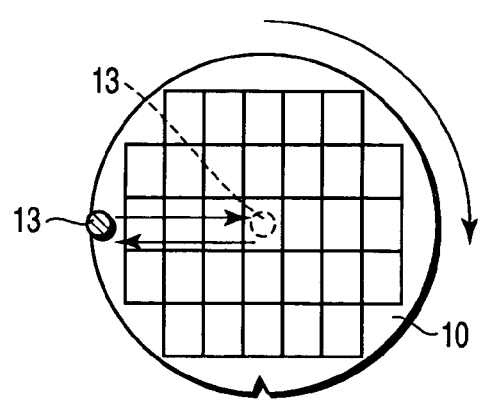
F I G. 4A
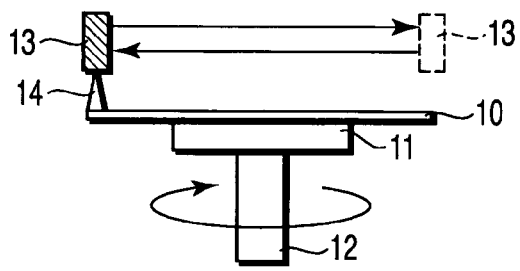
F I G. 3B
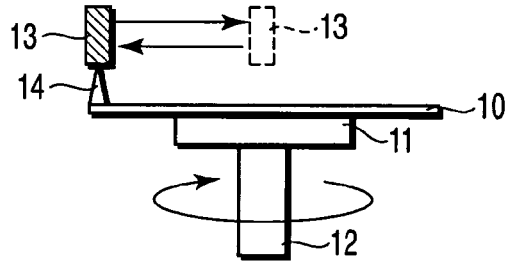
F I G. 4B
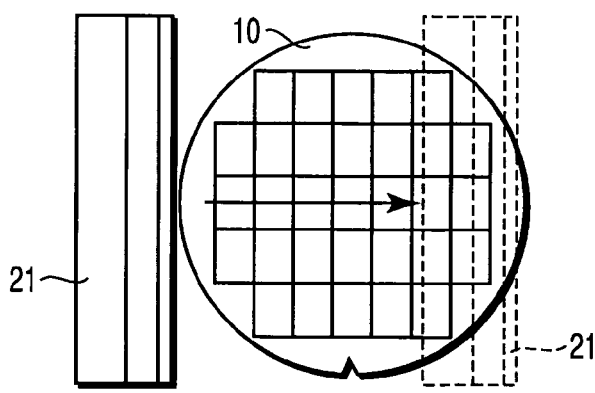
F I G. 5A
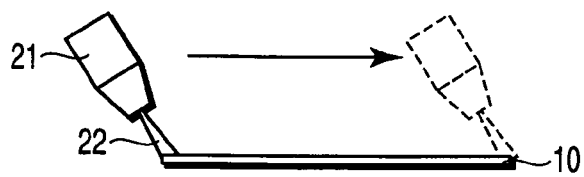
F I G. 5B

RESIST PATTERN FORMING METHOD, SEMICONDUCTOR APPARATUS USING SAID METHOD, AND EXPOSURE APPARATUS THEREOF

CROSS-REFERENCE TO RELATED APPLICATIONS

This application is based upon and claims the benefit of priority from prior Japanese Patent Application No. 2004-087420, filed Mar. 24, 2004, the entire contents of which are incorporated herein by reference.

BACKGROUND OF THE INVENTION

1. Field of the Invention

The present invention relates to a resist pattern forming method, a semiconductor apparatus using said method, and an exposure apparatus thereof, and more particularly to a method for forming a resist pattern by exposing a resist film formed on a substrate through a liquid in order to form a latent image and then performing selective development, and a semiconductor apparatus using the method, and an exposure apparatus thereof.

2. Description of the Related Art

An immersion exposure apparatus employs a technique which performs exposure by filling a liquid between a resist film surface and a lens of an exposure apparatus when a resist film formed on a substrate in process is exposed. As apparatuses used in such an exposure method, there is an apparatus disclosed in, e.g., Jpn. Pat. Appln. KOKAI Publication No. 10-303114. This patent reference discloses an apparatus, which has a stage capable of supplying water, immerses an entire substrate in water and performs exposure while relatively moving the stage with respect to the exposure apparatus. In the apparatus having such a conformation, since a liquid is supplied to the entire stage, there is a problem that liquid spills from the stage when the stage moves at a high speed, making a high-speed driving hard.

As a countermeasure for a disturbance of a liquid flow due to movement of the stage, a technique which drives the stage while locally supplying liquid to a part being exposed is disclosed in "Immersion lithography; its potential performance and issues," Proc. of SPIE Vol. 5040, pp. 724-733, by Soichi Owa and Hiroyuki Nagasaka. The stage can be moved at a high speed by the technique disclosed in the reference. When such a technique of locally supplying liquid is used, there are problems that water remains in an exposure area or the like in a part from which a lens is gone, and if performing post-exposure heating to the resist film in such a state, then a water mark and/or a resist pattern defect due to insufficient temperature are generated at the part where the water has remained, for example.

Further, when performing exposure near an edge of a substrate, water may flow to an edge portion of a resist film in some cases. In such a case, a turbulent in water flow is generated at step between the substrate and the edge of the resist film, and an air bubble can be caught. When the air bubble reaches an exposure slit area, an exposure trouble may possibly occur in some cases. There is a problem that a resist pattern defect is generated due to the exposure trouble.

Therefore, in the immersion exposure which performs exposure through the liquid film formed in a local area on the substrate, there is need for a resist pattern forming method which can suppress an occurrence of a defect in a resist pattern.

BRIEF SUMMARY OF THE INVENTION

According to one aspect of the present invention, there is provided a resist pattern forming method comprising: forming a resist film on a substrate; mounting the substrate formed the resist film thereon and a reticle formed a pattern thereon onto an exposure apparatus comprising a projection optical system; supplying a first chemical solution onto the resist film to selectively form a first liquid film in a local area on the resist film and draining the first chemical solution supplied, wherein the first liquid film has a flow, and wherein the first liquid film is being formed between the resist film and the projection optical system; transferring the pattern formed on the reticle to the resist film, with the first liquid film being formed, to form a latent image in the resist film; supplying a second chemical solution onto the resist film to form a second liquid film on a substantially entire surface of the substrate; removing the second liquid film; heating the resist film formed the latent image therein after the removal; and developing the resist film to form a resist pattern from the resist film heated.

According to another aspect of the present invention, there is provided a resist pattern forming method comprising: forming a resist film on a substrate; mounting the substrate formed the resist film thereon and a reticle formed a pattern thereon onto an exposure apparatus comprising a projection optical system; supplying a first chemical solution onto the resist film to selectively form a first liquid film in a local area on the resist film and draining the first chemical solution supplied, wherein the first liquid film has a flow, and wherein the first liquid film is being formed between the resist film and the projection optical system; transferring the pattern formed on the reticle to the resist film, with the first liquid film being formed, to form a latent image in the resist film; spraying a gas from a gas injection portion to a part of a surface of the resist film; scanning the gas injection portion over the substantially entire surface of the substrate to spray the gas on the surface of the resist film; heating the resist film formed the latent image therein after the scanning; and developing the resist film to form a resist pattern from the resist film heated.

According to still another aspect of the present invention, there is provided a resist pattern forming method comprising: forming a resist film on a substrate; mounting the substrate formed the resist film thereon and a reticle formed a pattern thereon onto an exposure apparatus comprising a projection optical system; supplying a first chemical solution onto the resist film to selectively form a first liquid film in a local area on the resist film and draining the first chemical solution supplied, wherein the first liquid film has a flow, and wherein the first liquid film is formed between the resist film and the projection optical system; controlling a direction of the flow of the first liquid film to flow from an area to which the pattern is transferred towards an edge of the resist film on the substrate when the edge of the resist film is included in the area where the first liquid film is selectively formed; transferring the pattern formed on the reticle to the resist film, with the first liquid film being formed, to form a latent image in the resist film; heating the resist film formed the latent image therein after the removal; and developing the resist film to form a resist pattern from the resist film heated.

According to yet another aspect of the present invention, there is provided a method for manufacturing a semiconductor apparatus, comprising: preparing a semiconductor wafer; forming a resist film on the semiconductor wafer; mounting the semiconductor wafer formed the resist film thereon and a reticle formed a pattern thereon onto an exposure apparatus comprising a projection optical system; supplying a first chemical solution onto the resist film to selectively form a first liquid film in a local area on the resist film and draining the first chemical solution supplied, wherein the first liquid film has a flow, and wherein the first liquid film is formed between the resist film and the projection optical system; transferring the pattern formed on the reticle to the resist film, with the first liquid film being formed, to form a latent image in the resist film; supplying a second chemical solution onto the resist film to form a second liquid film on a substantially entire surface of the semiconductor wafer; removing the second liquid film; heating the resist film formed the latent image therein after the removing; and forming a resist pattern on the semiconductor wafer by developing the resist film heated.

According to a further aspect of the present invention, there is provided an exposure apparatus comprising: an exposure unit comprising a projection optical system which forms a latent image in a resist film formed on a substrate by transferring a reticle pattern, wherein the exposure unit comprises a first chemical solution supply/drain subunit to selectively form a first liquid film having a flow between the resist film in a local area thereof and the projection optical system; and a water processing unit to form a second liquid film on a substantially entire surface of the substrate including the resist film formed the latent image therein, and remove the second liquid film.

BRIEF DESCRIPTION OF THE SEVERAL VIEWS OF THE DRAWING

FIGS. 3A and 3B are views illustrating a state in which cleaning process according to an embodiment of the present invention is carried out;

FIGS. 4A and 4B are views illustrating a state in which cleaning process according to an embodiment of the present invention is carried out;

FIGS. 5A and 5B are views illustrating a state in which cleaning liquid removing process according to an embodiment of the present invention is carried out;

DETAILED DESCRIPTION OF THE INVENTION

Figure 1:
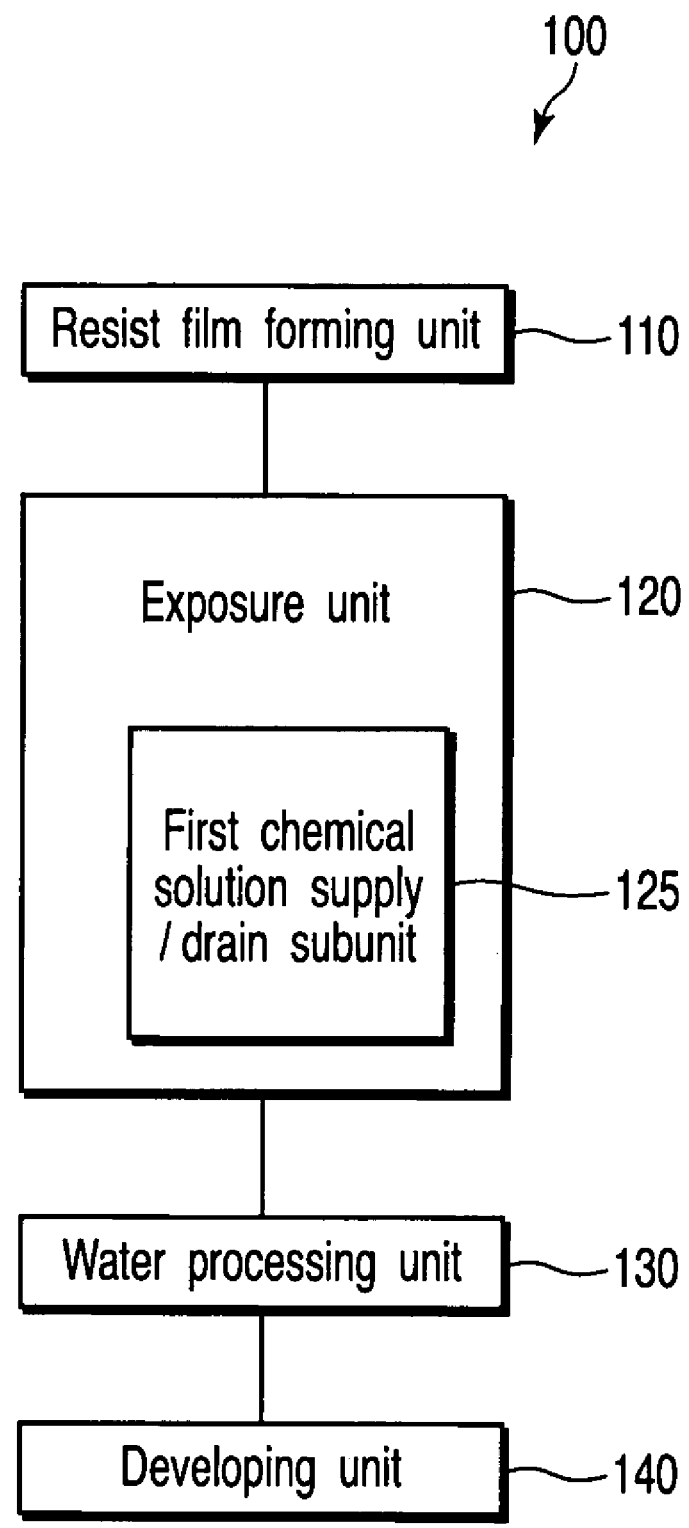
FIG. 1 is a block diagram illustrating a resist pattern forming system including an exposure apparatus according to an embodiment of the present invention.

Embodiments according to the present invention will now be described hereinafter with reference to the accompanying drawings.

A resist pattern forming apparatus 100 according to an embodiment of the present invention comprises a resist film forming unit 110, an exposure unit 120, a water processing unit 130, and a developing unit 140. The resist film forming unit 110 forms a resist film on a substrate. Furthermore, it can be provided with a function which cleans a surface of the resist film formed. The exposure unit 120 comprises an immersion exposure device which selectively forms a liquid film in a local area on the resist film and exposes the resist film through the liquid film formed, and forms a latent image in the resist film. The exposure unit 120 further comprises a chemical solution supply/drain subunit 125 for forming the liquid film. The water processing unit 130 cleans the resist film having the latent image formed therein, and the developing unit 140 elicits the latent image in the resist film by development, thereby generating a resist pattern.

Figure 2:
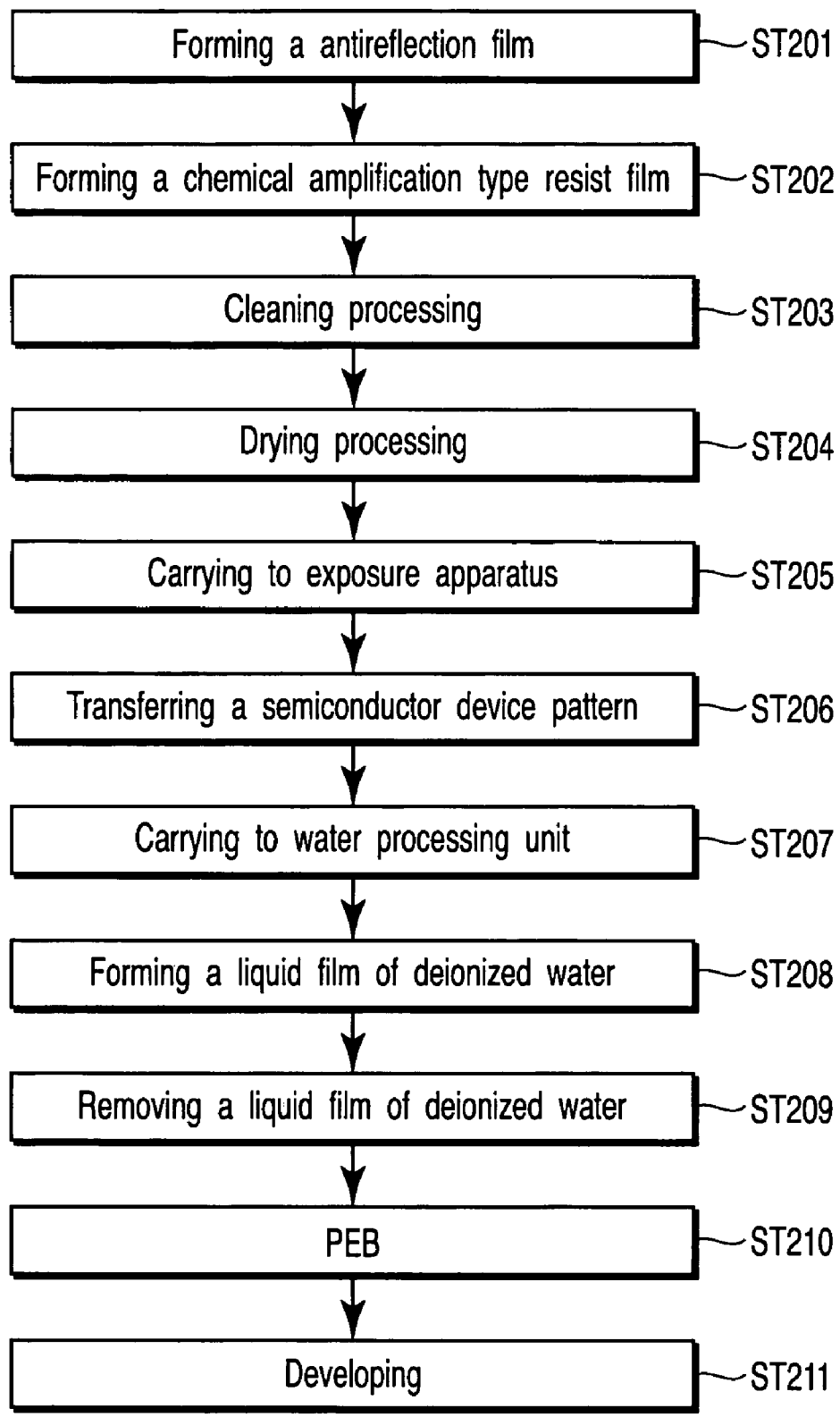
FIG. 2 is a process flowchart illustrating a semiconductor device manufacturing process according to an embodiment of the present invention.

A resist pattern forming method according to an embodiment of the present invention will now be described hereinafter based on a process flowchart shown in FIG. 2, with reference to FIGS. 3 to 11.

After an antireflection film application material is dropped, spun and spread over a semiconductor substrate, a heat treatment is performed so that an antireflection film having a thickness of approximately 50 nm is formed (step ST201). An ArF chemically amplified type resist film containing an acid-forming agent is formed with a film thickness of 200 nm on the antireflection film (step ST202). The chemically amplified type resist can be formed in accordance with the following procedure. A chemically amplified type resist application material is spread over the antireflection film by spin coat method. Then, heat treatment is performed, thereby removing a solvent contained in the resist application material.

According to a surface analysis of the ArF chemically amplified type resist film performed additionally, it is found that an acid-forming agent or an acid-trapping agent (e.g., amine) is existed on a film surface. In order to remove the acid-forming agent or the acid-trapping agent on the resist film surface, deionized water is supplied onto the resist film so that cleaning process is effected (step ST203). The acid-forming agent and the acid-trapping agent on the resist film surface can be removed by the cleaning. It is to be noted that a protection film can be further formed on the resist film to eliminate the affect of the acid-forming agent or the acid-trapping agent remaining on the film surface after the heat treatment in some cases. There may be a case where the acid-forming agent or the acid-trapping agent still exists on the protection film depending on the heating condition, thereby requiring the same cleaning process.

FIGS. 3A and 3B are views illustrating a state in which cleaning process according to an embodiment of the present invention is carried out. FIG. 3A is a plan view showing a state in which the cleaning process is carried out, and FIG. 3B is a side view showing a state in which the cleaning process is effected.

As shown in FIGS. 3A and 3B, the semiconductor substrate 10 is held on a substrate support portion 11. The substrate support portion 11 is spun by a drive portion 12. Deionized water (a third chemical solution) 14 as a cleaning liquid is supplied to the semiconductor substrate from a cleaning nozzle 13 while spinning the semiconductor substrate 10. In the cleaning process, as shown in FIG. 3A, the cleaning nozzle 13 is reciprocated between one end and the other end of the substrate 10. When the cleaning nozzle 13 is positioned at a peripheral portion of the substrate 10, a moving speed of the nozzle 13 is made slower than a moving speed of the nozzle 13 positioned at the central portion of the substrate 10. As a result, amount of the cleaning liquid supplied per unit area of the substrate 10 becomes substantially identical, thereby enhancing the cleaning effect. It is to be noted that, if the nozzle 13 moves in a uniform speed, the same effect can be obtained by changing the number of revolutions of the substrate in inverse proportion to a position of the nozzle in the radial direction.

Moreover, the chemical solution is not limited to deionized water described in the embodiment as long as it is a chemical solution which can readily remove these materials. If a time required for cleaning is long, then short-time processing is enabled by using oxygen dissolved water, hydrogen dissolved water, carbonic acid dissolved water or the like. In case of using oxygen dissolved water, cleaning can be effectively performed by applying a dissolved oxygen of 10 ppm or below without giving damages on the film surface. Additionally, in case of using hydrogen water, an application of water substantially saturated with hydrogen (approximately 1.2 ppm) is effective. By selecting an appropriate chemical solution based on, e.g., an electronic potential generated on the film surface when the film surface is exposed to the chemical solution, or an electronic potential in the acid-forming agent or in the acid-trapping agent, the chemical solution gives better performance when the chemical solution is used under a condition that the acid-forming agent or the acid-trapping agent can be readily released from the film surface.

Further, as shown in FIGS. 4A and 4B, the nozzle 13 may be turned back between the central portion of the substrate 10 and one end of the peripheral portion of the substrate 10. FIGS. 4A and 4B are views showing a state in which cleaning process according to an embodiment of the present invention is performed. FIG. 4A is a plan view showing a state in which the cleaning process is effected, and FIG. 4B is a side view showing a state in which the cleaning process is carried out. In FIGS. 4A and 4B, like reference numerals denote parts the same as those in FIGS. 3A and 3B, thereby eliminating the explanation thereof.

Furthermore, although water is supplied in a direction orthogonal to the primary surface of the substrate 10, the present invention is not limited thereto. For example, water 14 may be supplied in a same direction to a spinning direction of the substrate 10. As a result, the impact shock when the deionized water 14 strikes on the film surface can be moderated, and cleaning can be carried out without damaging the film surface. Moreover, the acid-forming agent or the acid-trapping agent adsorbed to the film surface can be efficiently removed by supplying water 14 in a direction opposite to the spinning direction of the substrate 10. Additionally, the acid-forming agent or the acid-trapping agent removed from the film surface can be efficiently discharged to the outside of the substrate by supplying water 14 toward the outer periphery of the substrate 10.

Subsequently, resist film surface drying process is carried out (step ST204). As shown in FIGS. 5A and 5B, in the drying process, a gas 22 from which acid and alkali are filtered is sprayed on the primary surface of the substrate 10 from an air knife 21. An area to which the air knife 21 sprays air is only a part of the substrate surface. In order to spray air over an entire surface of the substrate 10, the air knife 21 scans the surface of the substrate 10 from one end to the other end. In this case, the substrate 10 may be spun or may be remained stationary. FIGS. 5A and 5B are views illustrating a state in which cleaning liquid removing process is carried out according to an embodiment of the present invention. FIG. 5A is a plan view showing a state in which the cleaning liquid removing process is affected, and FIG. 5B is a side view showing a state in which the cleaning liquid removing process is performed. The deionized water 14 may be removed from the film surface but be left some extent adsorbed on the film surface. It is desirable that a direction of the air 22 sprayed from the air knife 21 is an advancing direction of the air knife 21. By setting these directions to be the same, water can be efficiently removed in a short time. A key point of removing the deionized water 14 in the process is not to perform by heat treatment or by drying under a reduced pressure. If the heat treatment or drying under the reduced pressure is performed, the acid-forming agent and the acid-trapping agent seep from the inside of the resist film and appear again on the film surface, and hence the effect of the cleaning process performed is lost. In case of a substrate having a small diameter, the substrate may be spun and dried without using the air knife.

After the cleaning process, the substrate is carried to a scanning exposure apparatus (step ST205). A semiconductor device pattern formed on a reticle is transferred to the resist film by using the scanning exposure apparatus, thereby forming a latent image in the resist film (step ST206).

Figure 6:
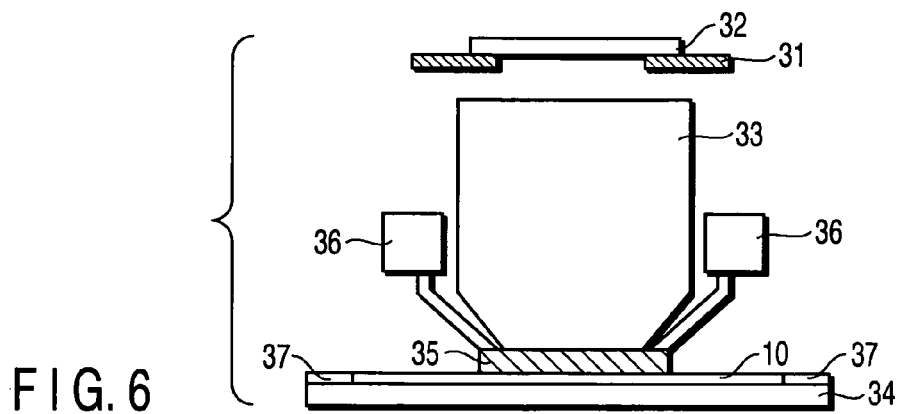
FIG. 6 is a view illustrating a general structure of an exposure apparatus according to an embodiment of the present invention.

The exposure apparatus used in the embodiment is of an immersion type. FIG. 6 is a view showing a general configuration of the exposure apparatus according to an embodiment of the present invention. A reticle stage 31 is disposed below an illumination optical system (not shown). The reticle 32 is provided on the reticle stage 31. The reticle stage 31 can move horizontally. A projection lens system 33 is disposed below the reticle stage 31. A wafer stage 34 is disposed below the projection lens system 33. The semiconductor substrate 10 subjected to the above-described processing is set on the wafer stage 34. The wafer stage 34 moves horizontally together with the semiconductor substrate 10. A support plate 37 is provided around the semiconductor substrate 10.

A fence 35 is disposed under the projection lens system 33. Pair of water supplier/drainer 36, which performs supply of water (a first chemical solution) into the fence 35 and drain off water inside the fence 35, is provided on sides of the projection lens system 33. When exposure is performed, a space in an area surrounded by the fence 35 and between the projection lens system 33 and the substrate 10 is filled with the liquid film of water (a first liquid film). An exposure light emitted from the projection lens system 33 passes through a layer of water and reaches an area being irradiated on the resist film. An image of a mask pattern (not shown) of the reticle 32 is projected onto the resist film on the substrate surface in that irradiation area, thereby forming a latent image therein.

Figure 7:
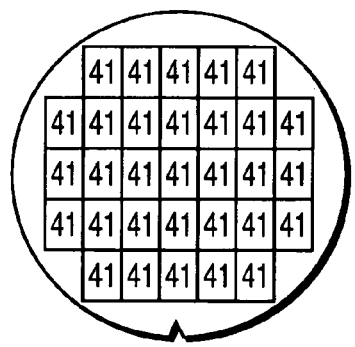
FIG. 7 is a plan view showing an example of the arrangement of exposure fields on a substrate.
Figure 8A:
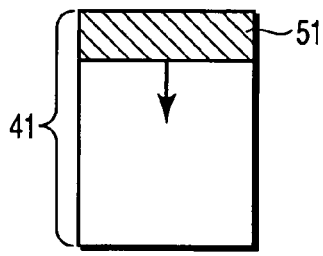
FIGS. 8A to 8C are views illustrating scanning exposure according to an embodiment of the present invention.
Figure 8B:
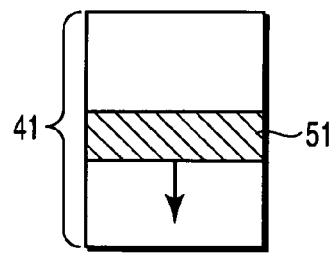
Figure 8C:
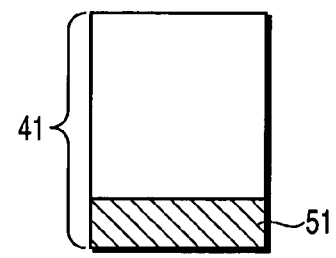
Figure 9A:
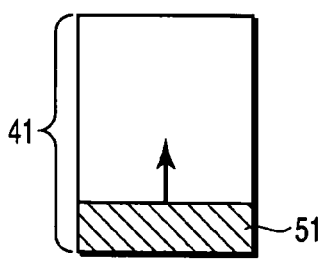
FIGS. 9A to 9C are views illustrating scanning exposure according to another embodiment of the present invention.
Figure 9B:
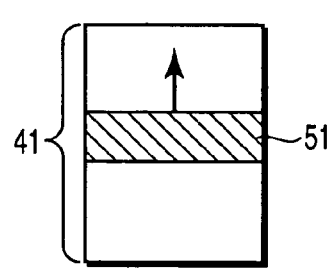
Figure 9C:
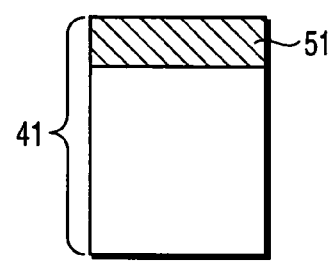

FIG. 7 is a plan view showing an example of the arrangement of exposure fields being formed on the substrate. The mask pattern formed on the reticle is projected and transferred to each rectangular exposure field 41 on the substrate 10 by a scanning exposure. FIGS. 8A to 8C and FIGS. 9A to 9C are views Illustrating the scanning exposure according to an embodiment of the present invention. In the scanning exposure, for example, as shown in FIGS. 8A to 8C, an exposure slit area 51 scans the exposure field 41 from an upper side to a lower side of a page surface. Alternatively, as shown in FIGS. 9A to 9C, the exposure slit area 51 scans the exposure field 41 from the upper side to the lower side of the page surface.

Figure 10:
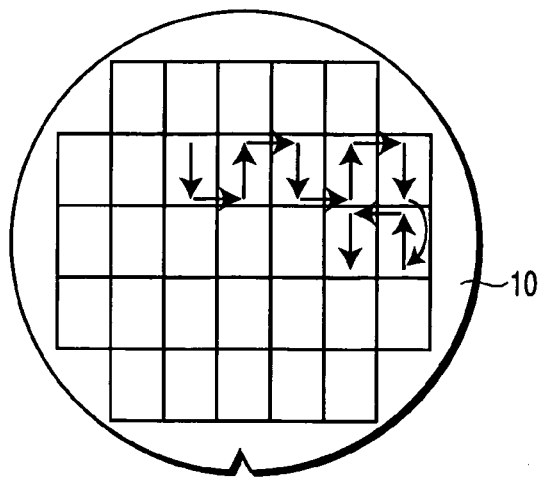
FIG. 10 is a plan view illustrating an order of an exposure of exposure fields when a scanning exposure is sequentially performed according to an embodiment of the present invention.

FIG. 10 is a plan view showing an example of an exposure order of the exposure fields when the scanning exposure is sequentially performed. Each of an upward arrow and a downward arrow in FIG. 10 indicates a direction along which the exposure slit area moves. As shown in FIG. 10, when one exposure field is subjected to the scanning exposure and then another scanning exposure is performed to an adjacent exposure field, directions of the scanning are opposite each other. The entire surface of the substrate is exposed by repeating such operations.

Figure 11:
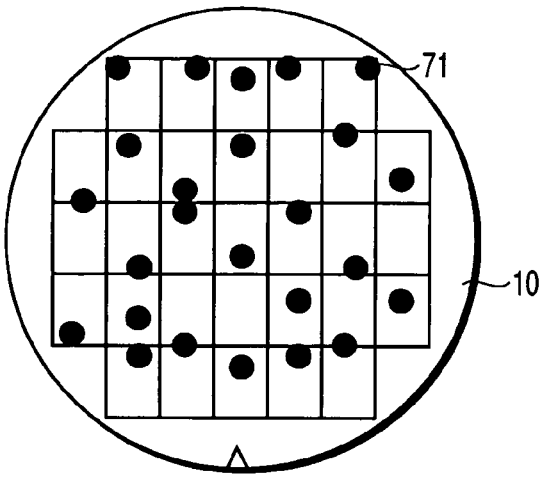
FIG. 11 is a plan view illustrating an example of droplets remaining on a substrate after the scanning exposure according to an embodiment of the present invention.

During the scanning exposure, the water supplier/drainer 36 drains water to prevent water from remaining outside of the surrounded area by the fence 35. However, droplets of residual water 71 are produced on the substrate 10 as shown in FIG. 11, if the resist film on the substrate is hydrophobic (a contact angle of the resist film to water is large), a moving speed of the stage is high, an acceleration and deceleration speed of the stage is high, or an exposure area is relatively large. When the next heat treatment (post exposure bake) is performed with water locally remained on the resist film as described above, heat is absorbed by the water remained and amount of heat supplied to the resist film is reduced as compared with other part, a reaction in the resist film caused by heating is insufficient at that part, resulting to cause a defect in a line width. If the resist is a positive resist, an unopened defect is generated. If the resist is a negative resist, an open defect is disadvantageously generated.

In order to prevent these problems, it is desired to remove the residual water 71 remained on the substrate after the immersion exposure. In general, a spin dry is used to remove the residual water on the substrate 10. However, since the residual water 71 is scattered on the substrate 10, it is hard to remove the residual water 71 completely by the spin dry.

In the present embodiment, the following processing is carried out to remove the residual water 71. Specifically, the substrate having the resist film with the latent image formed therein is carried to the water processing unit 130 (step ST207). Deionized water (a second chemical solution) is supplied onto the entire surface of the substrate 10, thereby forming a liquid film (a second liquid film) on the substantially entire surface of the substrate 10 (step ST208). Like the drying after the cleaning process in step ST204, the liquid film of the deionized water is removed by the spin dry or the air knife (step ST209). The water on the film surface (the residual water+the liquid film) is completely removed by the processing. However, if the water cannot be completely removed, it may be preferred to form a state in which the water is equivalently adsorbed among chips. By adsorbing the water among chips in such a manner, a desired resist pattern can finally be obtained by feeding back a dimensional shift produced after post exposure bake to a mask dimension used in exposure in advance as a dimension conversion difference. It is to be noted that water is used in the example, but the present invention is not limited thereto. It can also be used a chemical solution which has a good affinity to water, does not damage the resist film, and has a heat of evaporation smaller than that of a droplet (in this embodiment, water: evaporation heat=583 cal/g at 100° C.), e.g., an alcohol-based or ether-based chemical solution, or dissolve such a chemical solution in a solvent having the same component as the droplet (same component as the first chemical solution). It is much better that a chemical solution to be used has quick-drying properties. Such processing is also effective to not only the resist film surface but also the protection film surface when the protection film is used.

Further, in the immersion exposure, the resist pattern may not be formed in a predetermined accuracy because a photosensitive agent or the like seeps into the water from the resist film and the photosensitive agent adsorbs again to the resist surface at a stagnant part, for example. In the present embodiment, the photosensitive agent or the like which has adsorbed again to the resist film surface can be cleaned out by supplying/removing the water after the immersion exposure. As a result, the accuracy of the resist pattern can be improved. It is to be noted that a chemical solution having a heat of vaporization smaller than that of water, e.g., an alcohols or ethers, can be supplied/dried on the resist film surface to remove the water adsorbed on the surface after supplying/draining the water, thus more homogeneous baking can be carried out in the next baking process. Such processing is effective to not only the resist film surface but also the protection film surface when it is used.

The substrate subjected to the above-described processing is carried to a baker where the substrate is heated (PEB: post exposure bake) (step ST210). Diffusion and an amplification reaction of an acid generated in the exposure step are executed during the heating. Then, the substrate is carried to the developing unit 140 where development is performed, thereby forming an ArF resist pattern (step ST211).

Meanwhile, the process from at least the exposure unit to the baker unit through the water processing unit after exposure should be performed in a controlled atmosphere. It has been revealed that a concentration of a basic material in the atmosphere must be controlled to 10 ppb or less to suppress deactivation of the acid generated in the resist to an extent that formation of a resist pattern is not affected. Moreover, an experimental result says that it is desirable to manage a processing time, including a carriage time, within a range of ±10%.

According to the embodiment, the residual water on the resist film surface can be removed by supplying water onto the resist film after the immersion exposure and removing the water. As a result, occurrence of a pattern defect can be suppressed.

It is to be noted that supply of the deionized water (step ST208) and removal of the deionized water (step ST209) are carried out to remove the residual water 71 scattered on the substrate after affecting the immersion exposure. However, it is also effective to scan the air knife 21, which sprays a gas from a slit-like nozzle to the substrate locally, on the surface of the substrate to remove the residual water 71 like the drying process at step ST203. Alternatively, an air gun may be scanned on the surface of the substrate in place of the air knife. However, the air knife has a higher residual water removing capability than the air gun. Therefore, it is preferred to remove the residual water 71 by using the air knife rather than the air gun.

Figure 12:
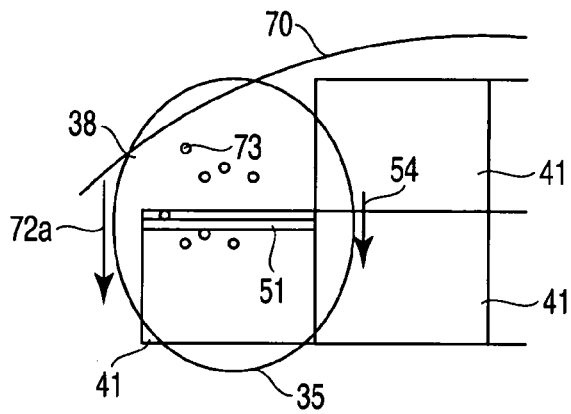
FIG. 12 is a plan view illustrating a scan direction of an exposure slit area and a water flow direction when there is a resist film edge in an immersion area.

A description will now be given as to a case of performing exposure in the peripheral portion of the substrate in the scanning exposure. FIG. 12 shows an example where water is caused to flow in a water flow direction 72a while scanning the exposure slit area 51 in a scan direction 54 in the exposure area 41. In FIG. 12, reference numeral 38 denotes an immersion area surrounded by the fence 35. The figure illustrates that air bubbles 73 taken in at a step of the resist film edge 70 are moved by the water flow and reach the exposure slit area 51, thereby causing an exposure defect. It is to be noted that air bubbles are also generated when the immersion area is at a boundary between the substrate 10 and a support plate (not shown).

Figure 13:
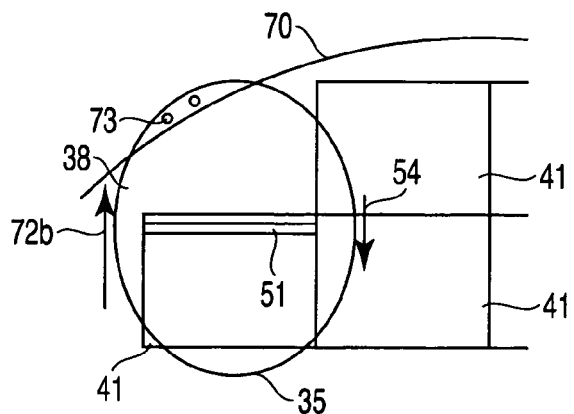
FIG. 13 is a plan view illustrating a scan direction of an exposure slit area and a water flow direction when there is a resist film edge in an immersion area.

In order to solve the problem, it is desired to control a direction of the water flow with respect to the edge of the resist film. As shown in FIG. 13, when a resist film edge 70 exists in the immersion area 38, it is desired to control a water flow direction 72b in a direction from the exposure slit area 51 toward the edge 70. Air bubbles 71 generated at the edge 70 can be effectively discharged without reaching the exposure slit area 51 by forming the water flow in this manner. It is more preferable to scan the exposure slit area 51 in the water flow direction at this moment since a rise in temperature of the flowing water can be prevented. In other words, the substrate 10 is moved in a direction opposite to the water flow direction.

Figure 14:
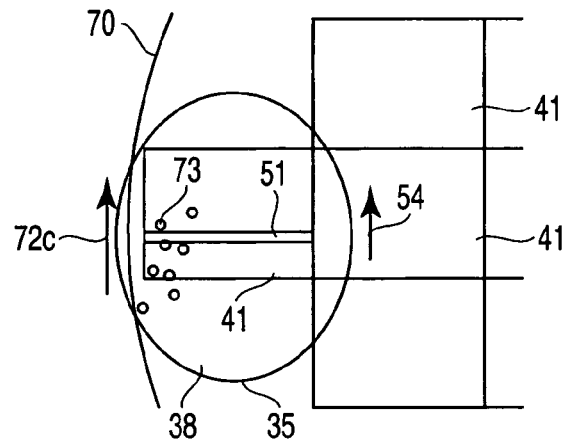
FIG. 14 is a plan view illustrating a scan direction of an exposure slit area and a water flow direction when there is a resist film edge in an immersion area.

Further, when a wafer edge exposure is performed, if a substrate edge exists in a direction substantially parallel with a scan direction of the exposure area in the immersion area, it is desired to provide a water pressure difference in the immersion area. FIG. 14 shows an example where water is caused to flow in a water flow direction 72c while scanning the exposure slit area 51 in the scan direction 54.

Figure 15:
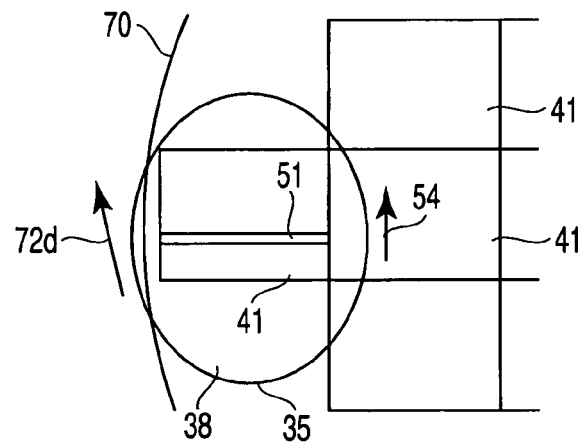
FIG. 15 is a plan view illustrating a scan direction of an exposure slit area and a water flow direction when there is a resist film edge in an immersion area.
Figure 16:
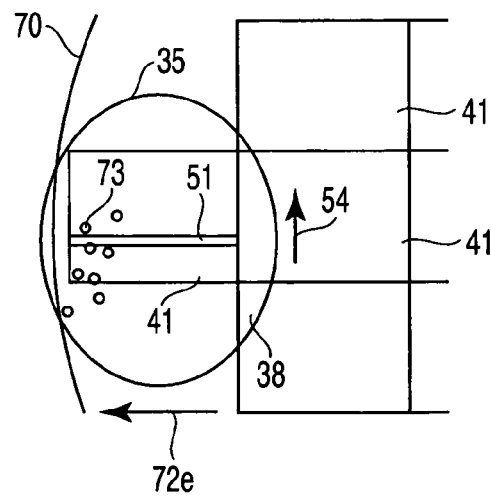
FIG. 16 is a plan view illustrating a scan direction of an exposure slit area and a water flow direction when there is a resist film edge in an immersion area.

In the process shown in FIG. 14, air bubbles are taken in at an edge 70, a conductance of the water at that portion becomes small, thus a pressure balance is lost. As a result, air bubbles flow to the inner side of the substrate. In order to prevent the phenomenon, it is desired to control a water flow direction 72d in a direction from the inner side of the substrate toward the outer side thereof as shown in FIG. 15. Specifically, it is desired to set a pressure of the water supply to be higher on the inner side of the substrate or set a drain pressure to be higher on the substrate edge side. Air bubbles can be discharged to the outside of the substrate by setting the water flow direction 72d toward the outer side of the substrate by using such techniques. Furthermore, as shown in FIG. 16, a water flow direction 72e may be caused to direct from the inner side toward the outer side of the substrate and orthogonal to an exposure area scan direction 54.

It is to be noted that, in the present embodiment, the degasified deionized water is used as the water interposed between the lens and the substrate in the exposure process, but the present invention is not limited thereto. It can also be used a liquid in which an alkaline ion of, e.g., group I or group II element, is added to increase a refractive index or in which an acid ion is added to reduce an absorption coefficient. In case of using an exposure apparatus which has a small absorption coefficient with respect to an exposure light and is matched with a specific refractive index, it can be used any liquid having a specific refractive index as long as it does not damage the lens system or the like.

Although the present invention relates to an exposure using an ArF (193 nm) light, it can be applied to an exposure using a KrF (248 nm) light by performing the same processing with similar accuracy. Moreover, it has been confirmed that patterning can be accurately carried out by using a fluorine-based oil as a first solvent in an $F_2$ (157 nm) exposure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A resist pattern forming method comprising:
   forming a resist film on a substrate;
   mounting the substrate formed the resist film thereon and a reticle formed a pattern thereon onto an exposure apparatus comprising a projection optical system;
   supplying a first chemical solution onto the resist film to selectively form a first liquid film in a local area on the resist film and draining the first chemical solution supplied, wherein the first liquid film has a flow, and wherein the first liquid film is being formed between the resist film and the projection optical system;
   transferring the pattern formed on the reticle to the resist film, with the first liquid film being formed, to form a latent image in the resist film;
   supplying a second chemical solution onto the resist film to form a second liquid film on a substantially entire surface of the substrate;
   removing the second liquid film;
   heating the resist film formed the latent image therein after the removal; and
   developing the resist film to form a resist pattern from the resist film heated.

2. The resist pattern forming method according to claim 1, wherein the removing the liquid film includes:
   spraying a gas from a gas injection portion to a part of the surface of the resist film; and
   scanning the gas injection portion over substantially entire surface of the substrate.

3. The resist pattern forming method according to claim 1, wherein the second chemical solution is the same solution as the first chemical solution.

4. The resist pattern forming method according to claim 1, wherein heat of vaporization of the second chemical solution is smaller than that of the first chemical solution.

5. The resist pattern forming method according to claim 1, wherein the second chemical solution has a property to dissolve the first chemical solution.

6. The resist pattern forming method according to claim 1, wherein the second chemical solution is a solution containing the same material as that of the first chemical solution.

7. The resist pattern forming method according to claim 1, further comprising:
   forming a protection film on the resist film before the mounting the substrate onto the exposure apparatus.

8. The resist pattern forming method according to claim 1, wherein one of materials constituting the resist film is an acid-forming agent or an acid-trapping agent,
   the method further comprising:
   cleaning the surface of the resist film to remove the acid-forming agent or the acid-trapping agent on the surface of the resist film before the transferring.

9. The resist pattern forming method according to claim 8, wherein the cleaning supplies a third chemical solution, which dissolves the acid-forming agent or the acid-trapping agent, onto the resist film.

10. The resist pattern forming method according to claim 9, wherein the third chemical solution is one of deionized water, ozone dissolved water, hydrogen dissolved water, or carbonate dissolved water.

11. A resist pattern forming method comprising:
    forming a resist film on a substrate;
    mounting the substrate formed the resist film thereon and a reticle formed a pattern thereon onto an exposure apparatus comprising a projection optical system;
    supplying a first chemical solution onto the resist film to selectively form a first liquid film in a local area on the resist film and draining the first chemical solution supplied, wherein the first liquid film has a flow, and wherein the first liquid film is being formed between the resist film and the projection optical system;

transferring the pattern formed on the reticle to the resist film, with the first liquid film being formed, to form a latent image in the resist film;

spraying a gas from a gas injection portion to a part of a surface of the resist film;

scanning the gas injection portion over the substantially entire surface of the substrate to spray the gas on the surface of the resist film;

heating the resist film formed the latent image therein after the scanning; and developing the resist film to form a resist pattern from the resist film heated.

12. The resist pattern forming method according to claim 11, wherein the gas injection portion is an air knife.

13. The resist pattern forming method according to claim 11, further comprising:

forming a protection film on the resist film before the mounting the substrate onto the exposure apparatus.

14. The resist pattern forming method according to claim 11, wherein one of materials constituting the resist film is an acid-forming agent or an acid-trapping agent, the method further comprising:

cleaning the surface of the resist film to remove the acid-forming agent or the acid-trapping agent on the surface of the resist film before the transferring.

15. The resist pattern forming method according to claim 14, wherein the cleaning supplies a third chemical solution which dissolves the acid-forming agent or the acid-trapping agent onto the resist film.

16. A resist pattern forming method comprising:

forming a resist film on a substrate;

mounting the substrate formed the resist film thereon and a reticle formed a pattern thereon onto an exposure apparatus comprising a projection optical system;

supplying a first chemical solution onto the resist film to selectively form a first liquid film in a local area on the resist film and draining the first chemical solution supplied, wherein the first liquid film has a flow, and wherein the first liquid film is formed between the resist film and the projection optical system;

controlling a direction of the flow of the first liquid film to flow from an area to which the pattern is transferred towards an edge of the resist film on the substrate when the edge of the resist film is included in the area where the first liquid film is selectively formed;

transferring the pattern formed on the reticle to the resist film, with the first liquid film being formed, to form a latent image in the resist film;

heating the resist film formed the latent image therein after the removal; and developing the resist film to form a resist pattern from the resist film heated.

17. The resist pattern forming method according to claim 16, wherein the transferring is carried out in accordance with a scanning exposure scheme which moves the substrate and the reticle horizontally with respect to the projection optical system, and the substrate is moved in a direction substantially opposite to the direction of the liquid flow.

18. A method for manufacturing a semiconductor apparatus, comprising:

preparing a semiconductor wafer;

forming a resist film on the semiconductor wafer;

mounting the semiconductor wafer formed the resist film thereon and a reticle formed a pattern thereon onto an exposure apparatus comprising a projection optical system;

supplying a first chemical solution onto the resist film to selectively form a first liquid film in a local area on the resist film and draining the first chemical solution supplied, wherein the first liquid film has a flow, and wherein the first liquid film is formed between the resist film and the projection optical system;

transferring the pattern formed on the reticle to the resist film, with the first liquid film being formed, to form a latent image in the resist film;

supplying a second chemical solution onto the resist film to form a second liquid film on a substantially entire surface of the semiconductor wafer;

removing the second liquid film;

heating the resist film formed the latent image therein after the removing; and forming a resist pattern on the semiconductor wafer by developing the resist film heated.

* * * * *